(12) United States Patent
Okada et al.

(10) Patent No.: US 6,444,333 B1
(45) Date of Patent: Sep. 3, 2002

(54) ORGANIC LUMINESCENT DEVICE MATERIAL, ORGANIC LUMINESCENT DEVICE USING THE SAME, AND TETRAARYLMETHANE COMPOUND

(75) Inventors: Hisashi Okada; Naoki Asanuma; Tadahisa Sato, all of Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/415,259

(22) Filed: Oct. 12, 1999

(30) Foreign Application Priority Data

Oct. 12, 1998 (JP) ............................. 10-289594
Oct. 12, 1998 (JP) ............................. 10-289595

(51) Int. Cl.$^7$ ............................................ H05B 33/12
(52) U.S. Cl. .................... 428/690; 428/917; 313/504; 313/506
(58) Field of Search ................. 428/690, 704, 428/917; 313/504, 506; 564/315, 330; 430/58.65

(56) References Cited

U.S. PATENT DOCUMENTS 3,180,730 A * 4/1965 Klupfel et al.
3,542,544 A * 11/1970 Seus et al.
3,567,450 A * 3/1971 Brantly et al.
3,658,520 A * 4/1972 Brantly et al.
4,720,432 A * 1/1988 VanSlyke et al. ............ 428/457
5,281,489 A * 1/1994 Mori et al. .................. 428/690

FOREIGN PATENT DOCUMENTS

DE    196 46 119 A 1    5/1998
WO    WO 00/03565    *    1/2000

* cited by examiner

*Primary Examiner*—Marie Yamnitzky
(74) *Attorney, Agent, or Firm*—Sughrue Mion, PLLC

(57) ABSTRACT

An organic luminescent device material which is a compound represented by the following formula (I):

Formula (I)

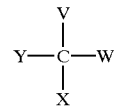

wherein V, W, X and Y each represents $L^1$—$NR^1R^2$, wherein $R^1$ and $R^2$ each represents an aliphatic hydrocarbon group, an aryl group or a heterocyclic group, $R^1$ and $R^2$ may be combined directly or indirectly to form a ring, and $L^1$ represents a divalent linking group containing an aryl group and/or an aromatic heterocyclic group.

6 Claims, No Drawings

ORGANIC LUMINESCENT DEVICE MATERIAL, ORGANIC LUMINESCENT DEVICE USING THE SAME, AND TETRAARYLMETHANE COMPOUND

BACKGROUND OF THE INVENTION

1. Field of the Invention

The present invention relates to a material for a luminescent (organic luminescent) device capable of converting electric energy into light and emitting light and also relates to a luminescent device using the material. The luminescent device can be suitably used in the fields of display device, display, back light, electrophotography, illumination light source, recording light source, reading light source, marking, billboard, interior decoration and the like.

The present invention also relates to a tetraarylmethane compound useful as a charge transporting agent for use in organic electroluminescent (EL) devices and electrophotographic photoreceptors.

2. Description of the Related Art

At the present time, developments and studies on various display devices are being aggressively made. In particular, organic electroluminescent (EL) devices can obtain highly bright luminescence at a low voltage and accordingly, are drawing an attention as a promising display device.

VanSlyke, Tang et al. reveal, for example, in U.S. Pat. Nos. 4,539,507 and 4,720,432, and JP-A-5-234681 (the term "JP-A" as used herein means an "unexamined published Japanese patent application") that when an aromatic tertiary amine containing a phenyl group, a phenylene group or a biphenylene group is used in the electron (hole) injecting and transporting zone of an internal connection organic electroluminescent (EL) device, the light output stability is improved and the operating life is prolonged. Thereafter, improvements of aromatic tertiary amine are studied by many researchers with an attempt to attain further stability of the light output, and reported in a large number of patent applications and scientific literatures. For example, biphenyl-base tertiary amines are reported in *Japanese Journal of Applied Physics*, 27, L269 (1988), JP-A-59-194393, *Appl. Phys. Lett.*, 66, 2679 (1995), JP-A-5-234681, JP-A-7-331238, JP-A-8-48656 and WO95/09147, and star burst tertiary amines are reported in *Appl. Phys. Lett.*, 65, 807 (1994), and JP-B-7-110940 (the term "JP-B" as used herein means an "examined Japanese patent publication"). However, the compounds heretofore disclosed are not satisfied in the performance (particularly, storage stability) and still in need of improvements.

Among organic EL devices, devices obtained by laminating organic substance layer through vacuum evaporation make a success in realizing light emission with high luminance. However, in view of simplification of the production process, workability and the like or for obtaining a large area, the device is preferably fabricated by a coating method. The devices fabricated by the conventional coating method are, however, inferior in the luminance of light emitted and the luminescent (quantum) efficiency as compared with the devices fabricated by the deposition method. Thus, improvements are still in need for attaining light emission with high luminance and high efficiency.

In recent years, the practical use of electrophotographic photoreceptor (organic photoconductor (OPC)) has been spreading rapidly, and the OPC completely plays a central role of electrophotographic photoreceptors. Most of recent OPCs are laminate type OPCs comprising a charge generating material (CGM) and a charge transfer material (CTM). Due to electrophotographic photoreceptors of laminate type OPC, sensitivity to visual light, charge retaining properties, surface strength, etc., are greatly improved. While hydrazone compounds (JP-B-55-42380, JP-A-57-101844, JP-A-54-150128, etc.), triarylamine compounds (JP-B-58-32372, etc.) and stilbene compounds (JP-A-58-198043, etc.) are used as CTM, the devices using these CTM compounds in the related art are inferior in properties (e.g., sensitivity) for recent speeding up. Accordingly, improvements are still in need. The study on CTM has been extensively carried out, and novel hydrazone compounds (JP-A-8-143550), carbazole type stilbene compounds (JP-A-8-59615) and tri-substituted ethylene compounds (JP-A-63-225660, JP-A-9-59256) are proposed recently. However, improvements are still in need.

SUMMARY OF THE INVENTION

An object of the present invention is to provide a material for an organic luminescent device capable of driving at low voltage, emitting light with high luminance and high efficiency, and exhibiting excellent stability on repeated use, and to provide an organic luminescent device using the material.

Another object of the present invention is to provide i a novel compound for use in organic electroluminescent (EL) and electrophotoraphic photoreceptors.

A further object of the present invention is to provide a novel charge transporting agent for use in organic electroluminescent (EL) devices and electrophotoraphic photoreceptors, which can exhibit excellent charge transporting ability or storage stability.

The above-described objects can be attained by the following means:

(1) an organic luminescent device material which is a compound represented by the following formula (I):

Formula (I)

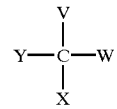

wherein V, W, X and Y each represents $L^1$—$NR^1R^2$, wherein $R^1$ and $R^2$ each represents an aliphatic hydrocarbon group, an aryl group or a heterocyclic group, $R^1$ and $R^2$ may be combined directly or indirectly to form a ring, and $L^1$ represents a divalent linking group containing an aryl group and/or an aromatic heterocyclic group;

(2) an organic luminescent device material which is a compound represented by the following formula (II):

Formula (II)

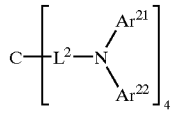

wherein $Ar^{21}$ and $Ar^{22}$ each represents an aryl group, $Ar^{21}$ and $Ar^{22}$ may be combined to each other directly or indirectly to form a ring, and $L^2$ represents a divalent linking group containing an aryl group and/or an aromatic heterocyclic group;

(3) an organic luminescent device material which is a compound represented by the following formula (III):

Formula (III)

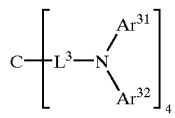

wherein $Ar^{31}$ and $Ar^{32}$ each represents an aryl group, $Ar^{31}$ and $Ar^{32}$ may be combined to each other directly or indirectly to form a ring, and $L^3$ represents an arylene group;

(4) an organic luminescent device material which is a compound represented by the following formula (IV):

Formula (IV)

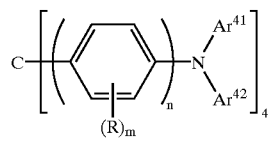

wherein $Ar^{41}$ and $Ar^{42}$ each represents an aryl group, $Ar^{41}$ and $Ar^{42}$ may be combined to each other directly or indirectly to form a ring, n represents an integer of from 1 to 4, R represents a substituent, and m represents an integer of from 0 to 4;

(5) an organic luminescent device comprising a pair of electrodes having formed therebetween a light emitting layer or a plurality of organic compound thin films including a light emitting layer, wherein at least one layer contains the organic luminescent device material described in (1) to (4) above;

(6) an organic luminescent device comprising a pair of electrodes having formed therebetween a light emitting layer or a plurality of organic compound thin films including a light emitting layer, wherein at least one layer comprises a polymer having dispersed therein the organic luminescent device material described in (1) to (4) above; and (7) a novel tetraarylmethane compound represented by the following formula (V):

Formula (V)

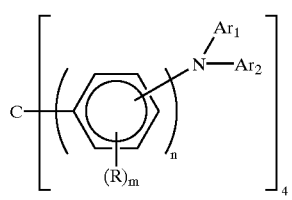

wherein $Ar_1$ and $Ar_2$, which may be the same or different, each represents an aryl group which may be substituted, $Ar_1$ and $Ar_2$ may be combined directly or indirectly through a linking group, R represents a halogen atom, an alkyl group which may be substituted, an aryl group which may be substituted, an alkoxy group which may be substituted, an aryloxy group which may be substituted, a dialkylamino group which may be substituted, an N-alkyl-N-arylamino group which may be substituted or a diarylamino group which may be substituted, when a plurality of Rs are present, Rs may be the same or different, m represents an integer of from 0 to 4, and n represents an integer of from 1 to 4.

DETAILED DESCRIPTION OF THE INVENTION

The compound represented by formula (I) is described in detail below.

V, W, X and Y, which may be the same or different, each represents $L^1$—$NR^1R^2$, wherein $R^1$ and $R^2$ each represents an aliphatic hydrocarbon group, an aryl group or a heterocyclic group, $R^1$ and $R^2$ may be combined directly or indirectly to form a ring, and $L^1$ represents a divalent linking group containing an aryl group and/or an aromatic heterocyclic group.

The aliphatic hydrocarbon group represented by $R^1$ or $R^2$ may be a linear, branched or cyclic hydrocarbon group and the hydrocarbon group is preferably an alkyl group (preferably having from 1 to 30 carbon atoms, more preferably from 1 to 20 carbon atoms, still more preferably from 1 to 12 carbon atoms, e.g., methyl, ethyl, iso-propyl, tert-butyl, n-octyl, n-decyl, n-hexadecyl, cyclopropyl, cyclopentyl, cyclohexyl), an alkenyl group (preferably having from 2 to 30 carbon atoms, more preferably from 2 to 20 carbon atoms, still more preferably from 2 to 12 carbon atoms, e.g., vinyl, allyl, 2-butenyl, 3-pentenyl) or an alkynyl group (preferably having from 2 to 30 carbon atoms, more preferably from 2 to 20 carbon atoms, still more preferably from 2 to 12 carbon atoms, e.g., propargyl, 3-pentynyl), more preferably an alkyl group or an alkenyl group, and still more preferably an alkyl group.

The aryl group represented by $R^1$ or $R^2$ is a monocyclic or condensed ring aryl group preferably having from 6 to 30 carbon atoms, more preferably from 6 to 20 carbon atoms, still more preferably from 6 to 12 carbon atoms, and examples thereof include phenyl, naphthyl, anthracenyl, phenanthrenyl and vinylene. Among these, preferred are phenyl and naphthyl.

The heterocyclic group represented by $R^1$ or $R^2$ is a monocyclic or condensed ring heterocyclic group (preferably having from 1 to 20 carbon atoms, more preferably from 1 to 12 carbon atoms, still more preferably from 2 to 10 carbon atoms), preferably an aromatic heterocyclic group containing at least one of nitrogen atom, oxygen atom, sulfur atom and selenium atom. Specific examples of the heterocyclic group represented by $R^1$ or $R^2$ include pyrrolidine, piperidine, pyrrole, furan, thiophene, imidazoline, imidazole, benzimidazole, naphthoimidazole, thiazolidine, thiazole, benzothiazole, naphthothiazole, isothiazole, oxazoline, oxazole, benzoxazole, naphthoxazole, isoxazole, selenazole, benzoselenazole, naphthoselenazole, pyridine, quinoline, isoquinoline, indole, indolenine, pyrazole, pyrazine, pyrimidine, pyridazine, tirazine, indazole, purine, phthalazine, naphtylidine, quinoxaline, quinazoline, cinnoline, pteridine, phenanthroline, tetrazaindene, oxadiazole, thiadiazole, triazole and tetrazole. Among these, pyrrole, thiophene, pyridine and quinoline are preferred, and thiophene, pyridine and quinoline are more preferred.

The aliphatic hydrocarbon group, the aryl group and the heterocyclic group represented by $R^1$ or $R^2$ each may have a substituent. Examples of the substituent include an alkyl group (preferably having from 1 to 20 carbon atoms, more preferably from 1 to 12 carbon atoms, still more preferably from 1 to 8 carbon atoms, e.g., methyl, ethyl, iso-propyl, tert-butyl, n-octyl, n-decyl, n-hexadecyl, cyclopropyl, cyclopentyl, cyclohexyl), an alkenyl group (preferably having from 2 to 20 carbon atoms, more preferably from 2 to 12 carbon atoms, still more preferably from 2 to 8 carbon atoms, e.g., vinyl, allyl, 2-butenyl, 3-pentenyl), an alkyl group (preferably having from 2 to 20 carbon atoms, more preferably from 2 to 12 carbon atoms, still more preferably from 2 to 8 carbon atoms, e.g., propargyl, 3-pentynyl), an aryl group (preferably having from 6 to 40 carbon atoms, more preferably from 6 to 30 carbon atoms, still more preferably from 6 to 20 carbon atoms, e.g., phenyl, p-methylphenyl, naphthyl), an amino group (preferably having from 0 to 50 carbon atoms, more preferably from 2 to 48 carbon atoms, still more preferably from 2 to 28 carbon atoms, e.g., amino, methylamino, dimethylamino, diethylamino, dibenzylamino), an alkoxy group (preferably having from 1 to 20 carbon atoms, more preferably from 1 to 12 carbon atoms, still more preferably from 1 to 8 carbon atoms, e.g., methoxy, ethoxy, butoxy), an aryloxy group (preferably having from 6 to 30 carbon atoms, more preferably from 6 to 20 carbon atoms, still more preferably from 6 to 18 carbon atoms, e.g., phenyloxy, 2-naphthyloxy), an acyl group (preferably having from 1 to 20 carbon atoms, more preferably from 1 to 16 carbon atoms, still more preferably from 1 to 12 carbon atoms, e.g., acetyl, benzoyl, formyl, pivaloyl), an alkoxycarbonyl group (preferably having from 2 to 20 carbon atoms, more preferably from 2 to 16 carbon atoms, still more preferably from 2 to 12 carbon atoms, e.g., methoxycarbonyl, ethoxycarbonyl), an aryloxycarbonyl group (preferably having from 7 to 20 carbon atoms, more preferably from 7 to 16 carbon atoms, still more preferably from 7 to 10 carbon atoms, e.g., phenyloxycarbonyl), an acyloxy group (preferably having from 2 to 20 carbon atoms, more preferably from 2 to 16 carbon atoms, still more preferably from 2 to 10 carbon atoms, e.g., acetoxy, benzoyloxy), an acylamino group (preferably having from 2 to 20 carbon atoms, more preferably from 2 to 16 carbon atoms, still more preferably from 2 to 10 carbon atoms, e.g., acetylamino, benzoylamino), an alkoxycarbonylamino group (preferably having from 2 to 20 carbon atoms, more preferably from 2 to 16 carbon atoms, still more preferably from 2 to 12 carbon atoms, e.g., methoxycarbonylamino), an aryloxycarbonylamino group (preferably having from 7 to 20 carbon atoms, more preferably from 7 to 16 carbon atoms, still more preferably from 7 to 12 carbon atoms, e.g., phenyloxy, carbonylamino), a sulfonamino group (preferably having from 1 to 20 carbon atoms, more preferably from 1 to 16 carbon atoms, still more preferably from 1 to 12 carbon atoms, e.g., methanesulfonylamino, benzenesulfonylamino), a sulfamoyl group (preferably having from 0 to 20 carbon atoms, more preferably from 0 to 16 carbon atoms, still more preferably from 0 to 12 carbon atoms, e.g., sulfamoyl, methylsulfamoyl, dimethylsulfamoyl, phenylsulfamoyl), a sulfamoylamino group (preferably having from 0 to 20 carbon atoms, more preferably from 1 to 16 carbon atoms, still more preferably from 1 to 12 carbon atoms, e.g., sulfamoylamino, 3-methylsulfamoylamino), a carbamoyl group (preferably having from 1 to 20 carbon atoms, more preferably from 1 to 16 carbon atoms, still more preferably from 1 to 12 carbon atoms, e.g., carbamoyl, methylcarbamoyl, diethylcarbamoyl, phenylcarbamoyl), an alkylthio group (preferably having from 1 to 20 carbon atoms, more preferably from 1 to 16 carbon atoms, still more preferably from 1 to 12 carbon atoms, e.g., methylthio, ethylthio), an arylthio group (preferably having from 6 to 20 carbon atoms, more preferably from 6 to 16 carbon atoms, still more preferably from 6 to 12 carbon atoms, e.g., phenylthio), a sulfonyl group (preferably having from 1 to 20 carbon atoms, more preferably from 1 to 16 carbon atoms, still more preferably from 1 to 12 carbon atoms, e.g., mesyl, tosyl), a sulfinyl group (preferably having from 1 to 20 carbon atoms, more preferably from 1 to 16 carbon atoms, still more preferably from 1 to 12 carbon atoms, e.g., methanesulfinyl, benzenesulfinyl), a ureido group (e.g., preferably having from 1 to 20 carbon atoms, more preferably from 1 to 16 carbon atoms, still more preferably from 1 to 12 carbon atoms, e.g., ureido, methylureido, phenylureido), a phosphoric acid amide group (preferably having from 1 to 20 carbon atoms, more preferably from 1 to 16 carbon atoms, still more preferably from 1 to 12 carbon atoms, e.g., diethylphosphoric acid amide, phenylphosphoric acid amide), a hydroxy group, a mercapto group, a halogen atom (e.g., fluorine, chlorine, bromine, iodine), a cyano group, a sulfo group, a carboxyl group, a nitro group, a hydroxamic acid group, a sulfino group, a hydrazino group, an imino group and a heterocyclic group (preferably having from 1 to 20, more preferably from 1 to 12 carbon atoms; examples of the hetero atom include nitrogen atom, oxygen atom, sulfur atom, and specific examples thereof include imidazolyl, pyridyl, quinolyl, furyl, piperidyl, morpholino, benzoxazolyl, benzimidazolyl and banzothiazolyl). These substituents each may be further substituted. When two or more substituents are present, they may be the same or different. Furthermore, if possible, the substituents may be combined to form a ring.

The substituent is preferably an alkyl group, an alkenyl group, an aralkyl group, an aryl group, an alkoxy group, an aryloxy group, an amino group, a halogen atom or a heterocyclic group, more preferably. an alkyl group, an alkenyl group, an aryl group, an alkoxy group, an aryloxy group, an amino group, a halogen atom or an aromatic heterocyclic group, still more preferably an alkyl group, an aryl group, an alkoxy group, an aryloxy group, an amino group or a halogen atom, particularly preferably an alkyl group having from 1 to 6 carbon atoms (e.g., methyl, tert-butyl, cyclohexyl), an aryl group having from 6 to 20 carbon atoms (e.g., phenyl, naphthyl, biphenyl), an alkoxy group having from 1 to 8 carbon atoms (e.g., methoxy, ethoxy, cyclohexyloxy), an aryloxy group having from 6 to 18 carbon atoms (e.g., phenoxy, naphthoxy), a dialkylamino group having from 2 to 8 carbon atoms (e.g., dimethylamino, diethylamino), an N-alkyl-N-arylamino group having from 7 to 15 carbon atoms (e.g., N-methyl-N-phenylamino, N-methyl-N-methylamino), a diarylamino group having from 12 to 28 carbon atoms (e.g., diphenylamino, N-(3-methylphenyl)-N-phenylamino, N-(1-naphthyl)-N-phenylamino) or a chlorine atom.

In the case where $R^1$ and $R^2$ are not combined directly or indirectly to form a ring, $R^1$ and $R^2$ each is preferably a substituted or unsubstituted phenyl group or a naphthyl group, more preferably a substituted or alkyl-substituted phenyl group or a naphthyl group.

In the case where $R^1$ and $R^2$ are combined directly or indirectly to form a ring, the number of ring member is from 5 to 7. In the case where $R^1$ and $R^2$ are combined indirectly, namely when a 6-membered or greater membered ring is formed, examples of the linking group include the following divalent groups.

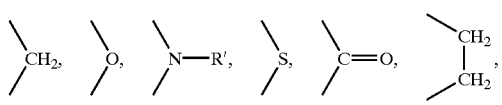

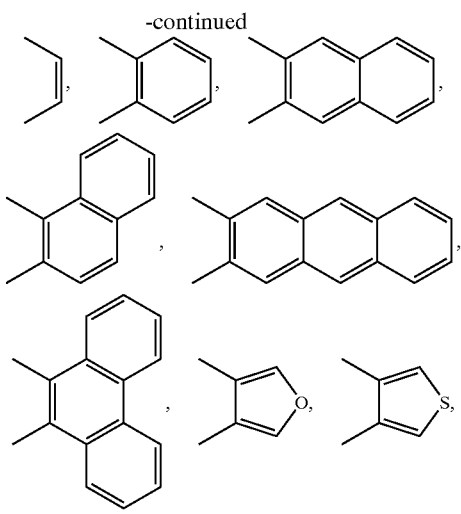

R' represents an alkyl or aryl group. The alkyl or aryl group may have a substituent and examples of the substituent include those described above as the substituent which $R^1$ or $R^2$ may have.

The divalent linking group represented by $L^1$ contains at least one aryl group or aromatic heterocyclic group and examples thereof include an arylene group, a divalent aromatic heterocyclic group and a combination of an arylene group or a divalent aromatic heterocyclic group with an alkylene group, an alkenylene group, —O—, —S—, —SO$_{O2}$—, —CO— or —N(Ra)— (wherein Ra represents a hydrogen atom, an aliphatic hydrocarbon group, an aryl group or a heterocyclic group).

The divalent linking group represented by $L^1$ is preferably an arylene group, a divalent aromatic heterocyclic group or a combination of an arylene group or a divalent aromatic heterocyclic group with —N(Ra)—. Examples thereof include the following divalent linking groups.

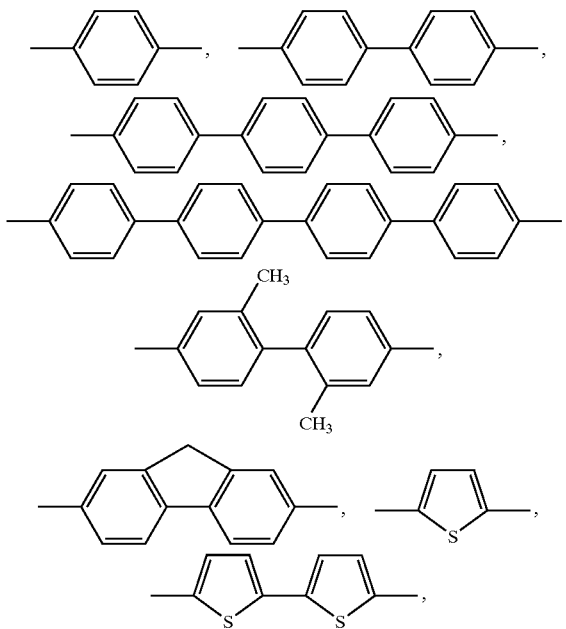

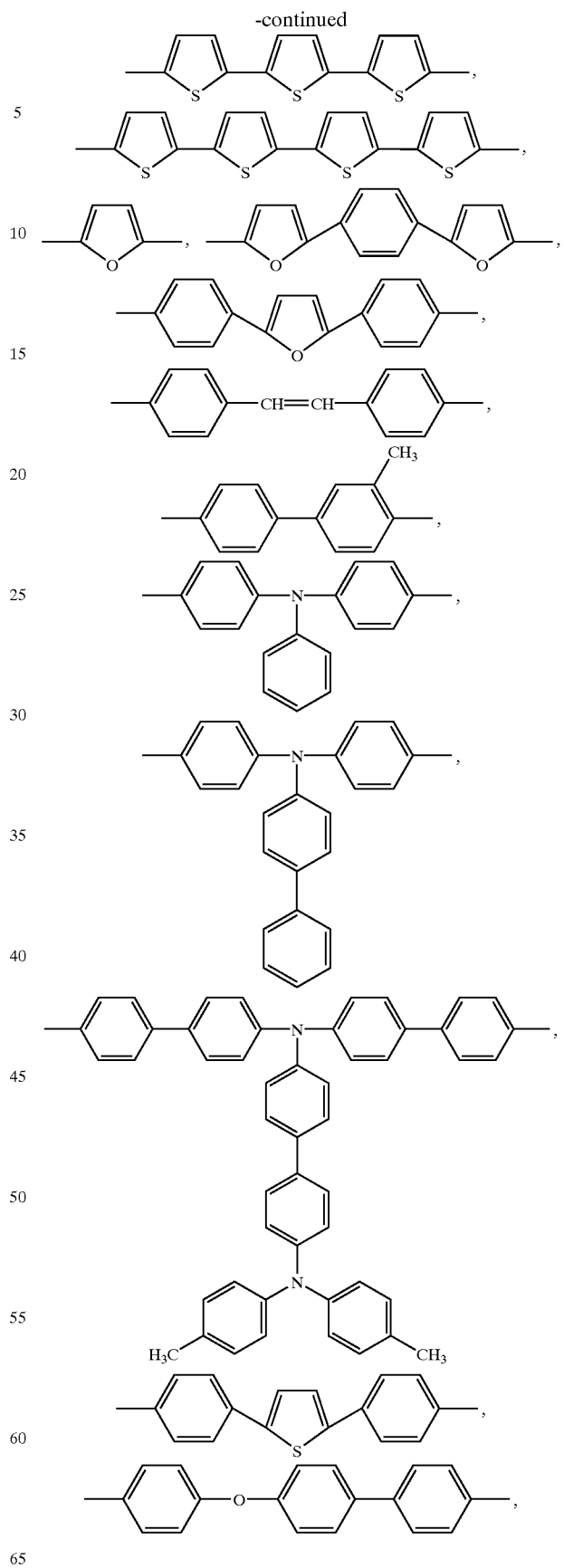

The divalent linking group represented by $L^1$ is more preferably an arylene group, still more preferably phenylene biphenylene, triphenylene or tetraphenylene, particularly preferably phenylene or biphenylene.

The divalent linking group represented by $L^1$ may have a substituent and examples of the substituent include those described above as the substituent of $R^1$ and $R^2$. The substituent of $L^1$ is preferably a halogen atom (e.g., fluorine, chlorine, bromine or iodine, preferably fluorine or chlorine, more preferably chlorine), an alkyl group (preferably having from 1 to 20 carbon atoms, e.g., methyl, ethyl, isopropyl, n-butyl, t-butyl, n-dodecyl, cyclohexyl), an aryl group (preferably having from 6 to 36 carbon atoms, e.g., phenyl, naphthyl, anthracenyl, phenanthrenyl, pyrenyl, naphthacenyl, pentacenyl, pentaphenyl), an alkoxy group (preferably having from 1 to 20 carbon atoms, e.g., methoxy, ethoxy, isopropoxy, n-hexyloxy, cyclohexyloxy, octyloxy, dodecyloxy), an aryloxy group (preferably having from 6 to 36 carbon atoms, e.g., phenoxy, naphthoxy, anthracenoxy, pentacenoxy), an amino group (preferably having from 2 to 20 carbon atoms), a dialkylamino group (e.g., N-ethyl-N-butylamino), an N-alkyl-N-arylamino group having from 7 to 42 carbon atoms (e.g., N-methyl-N-phenylamino, N-ethyl-N-phenylamino, N-isopropyl-N-(3-methylphenyl)amino, N-methyl-N-(1-naphthyl)amino, N-butyl-N-(1-naphthacenyl)amino) or a diarylamino group having from 12 to 48 carbon atoms (e.g., diphenylamino, N-phenyl-N-(1-naphthyl)amino, N-(1-naphthyl)-N-(1-naphthyl)amino, N-phenyl-N-(1-anthracenyl)-amino, N-(1-anthracenyl)-N-(1-phenanrenyl)amino).

The substituent of $L^1$ may be further substituted and examples of the substituent include a halogen atom, an alkyl group, an aryl group, a heterocyclic group, a cyano group, a hydroxy group, a nitro group, a carboxy group, a sulfo group, an amino group, an alkoxy group, an aryloxy group, an acylamino group, an alkylamino group, an anilino group, a ureido group, a sulfamoylamino group, an alkylthio group, an arylthio group, an alkoxycarbonylamino group, a sulfonamido group, a carbamoyl group,. a sulfamoyl group, a sulfonyl group, an alkoxycarbonyl group, a heterocyclic oxy group, an azo group, an acyloxy group, a carbamoyloxy group, a silyloxy group, an aryloxycarbonylamino group, an imido group, a heterocyclic thio group, a sulfinyl group, a phosphonyl group, an aryloxycarbonyl group, an acyl group, a silyl group and an azolyl group. Among these, an alkyl group, an aryl group, an alkoxy group, a dialkylamino group and a diarylamino group are preferred, and an alkyl group and a diarylamino group are more preferred.

Among the compounds represented by formula (I), the compound represented by the following formula (II) is preferred.

Formula (II)

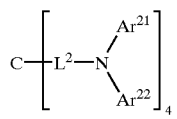

In formula (II), $Ar^{21}$ and $Ar^{22}$ each represents an aryl group and $Ar^{21}$ and $Ar^{22}$ may be combined to each other directly or indirectly to form a ring. The aryl group represented by $Ar^{21}$ or $Ar^{22}$ has the same meaning as the aryl group represented by $R^1$ or $R^2$ in formula (I) and the preferred range thereof is also the same.

$L^2$ represents a divalent linking group containing an aryl group and/or an aromatic heterocyclic group. The divalent linking group represented by $L^2$ has the same meaning as $L^1$ in formula (I) and the preferred range thereof is also the same.

Among the compounds represented by formula (I), the compound represented by the following formula (III) is more preferred.

Formula (II)

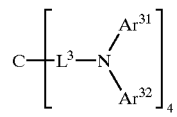

In formula (II), $Ar^{31}$ and $Ar^{32}$ each represents an aryl group and $Ar^{31}$ and $Ar^{32}$ may be combined to each other directly or indirectly to form a ring. The aryl group represented by $Ar^{31}$ or $Ar^{32}$ has the same meaning as the aryl group represented by $R^1$ or $R^2$ in formula (I) and the preferred range thereof is also the same.

$L^3$ represents an arylene group. The arylene group represented by $L^3$ has the same meaning as the arylene group described with respect to the divalent linking group represented by $L^1$ in formula (I) and the preferred range thereof is also the same.

Among the compounds represented by formula (I), the compound represented by the following formula (IV) is still more preferred.

Formula (IV)

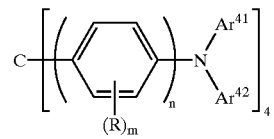

In formula (IV), $Ar^{41}$ and $Ar^{42}$ each represents an aryl group and $Ar^{41}$ and $Ar^{42}$ may be combined to each other directly or indirectly to form a ring. The aryl group represented by $Ar^{41}$ or $Ar^{42}$ has the same meaning as the aryl group represented by $R^1$ or $R^2$ in formula (I) and the preferred range thereof is also the same.

n represents an integer of from 1 to 4, preferably 1 or 2.

R represents a substituent. The substituent represented by R has the same meaning as the substituent of $L^1$ in formula (I) and the preferred range thereof is also the same.

m represents an integer of from 0 to 4, preferably 0 or 1. When m is an integer of from 2 to 4, the substituents R may be the same or different.

The compound represented by formula (I) of the present invention may be a low molecular weight compound, a high molecular weight compound (preferably having a weight average molecular weight of from 1,000 to 5,000,000, more preferably from 5,000 to 2,000,000, still more preferably from 10,000 to 1,000,000) in which the residue is connected to the polymer main chain, or a high molecular weight compound (preferably having a weight average molecular weight of from 1,000 to 5,000,000, more preferably from 5,000 to 2,000,000, still more preferably from 10,000 to 1,000,000) containing the compound of the present invention in the main chain thereof. In the case of a high molecular weight compound, the compound may be a homopolymer or a copolymer with another monomer.

As a matter of convenience, formula (I) is shown by a limiting structural formula, but a tautomer thereof may also be used.

Specific examples of the compound of the present invention are set forth below, however, the present invention should not be construed as being limited thereto.

1
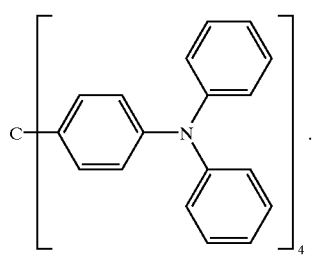
2
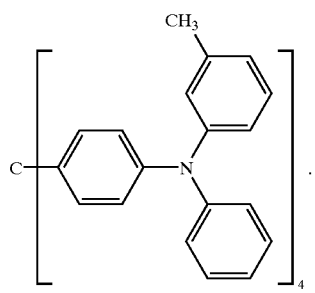
3
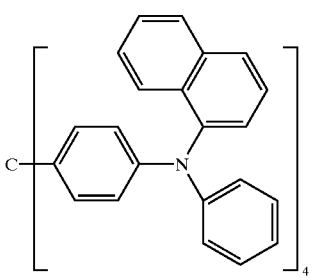
4
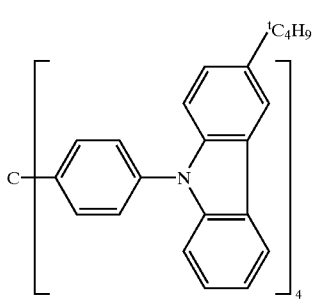
5
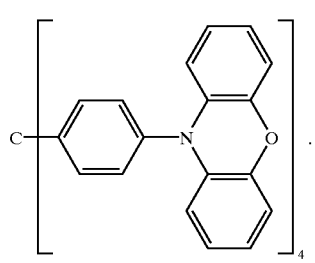
6
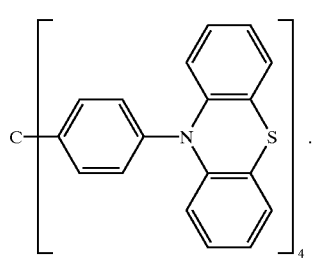
7
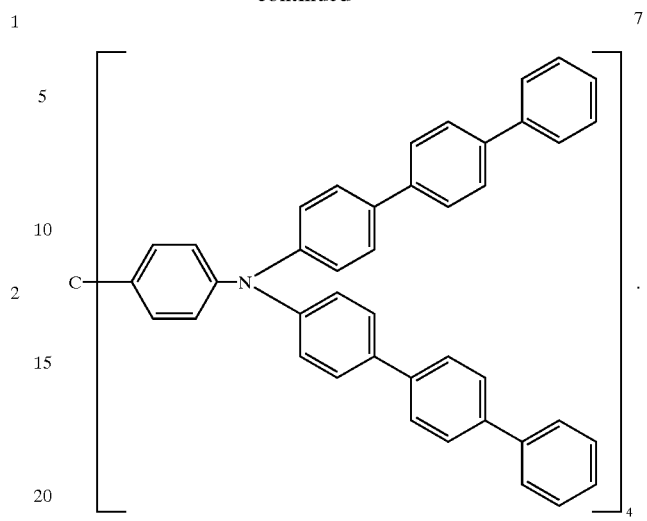
8
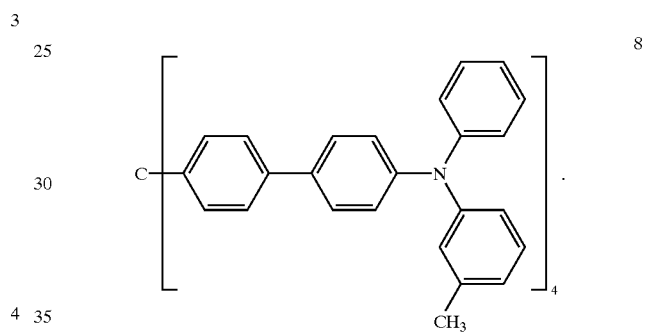
9
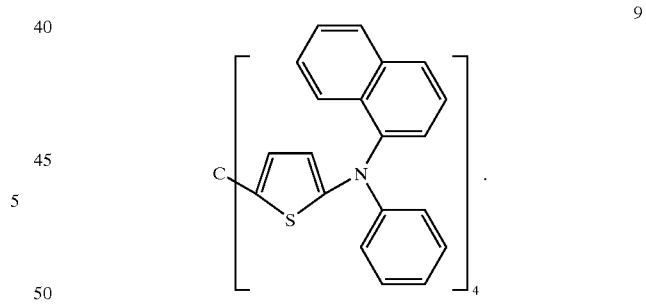
10
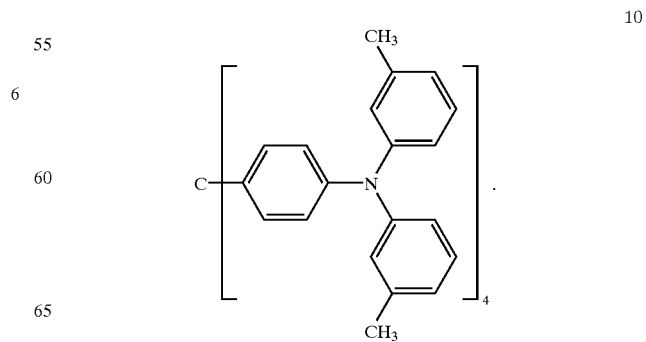

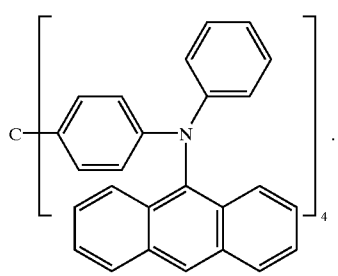
11
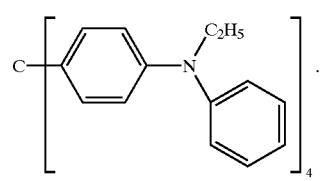
12
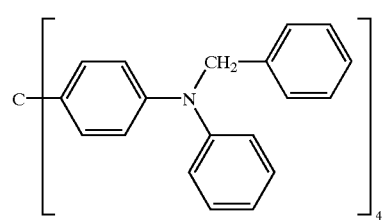
13
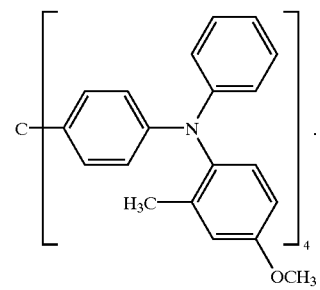
14
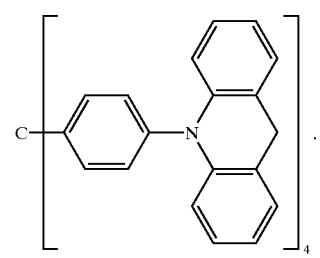
15
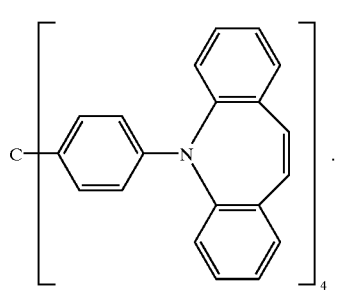
16
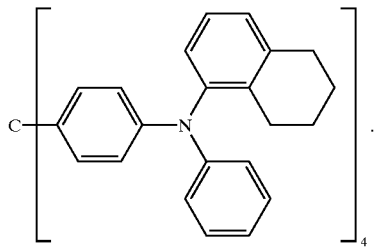
17
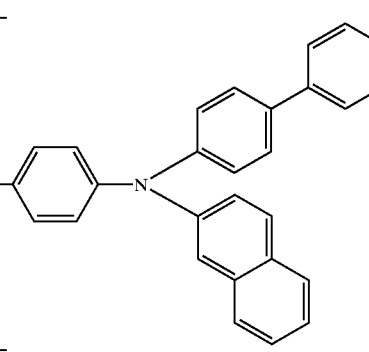

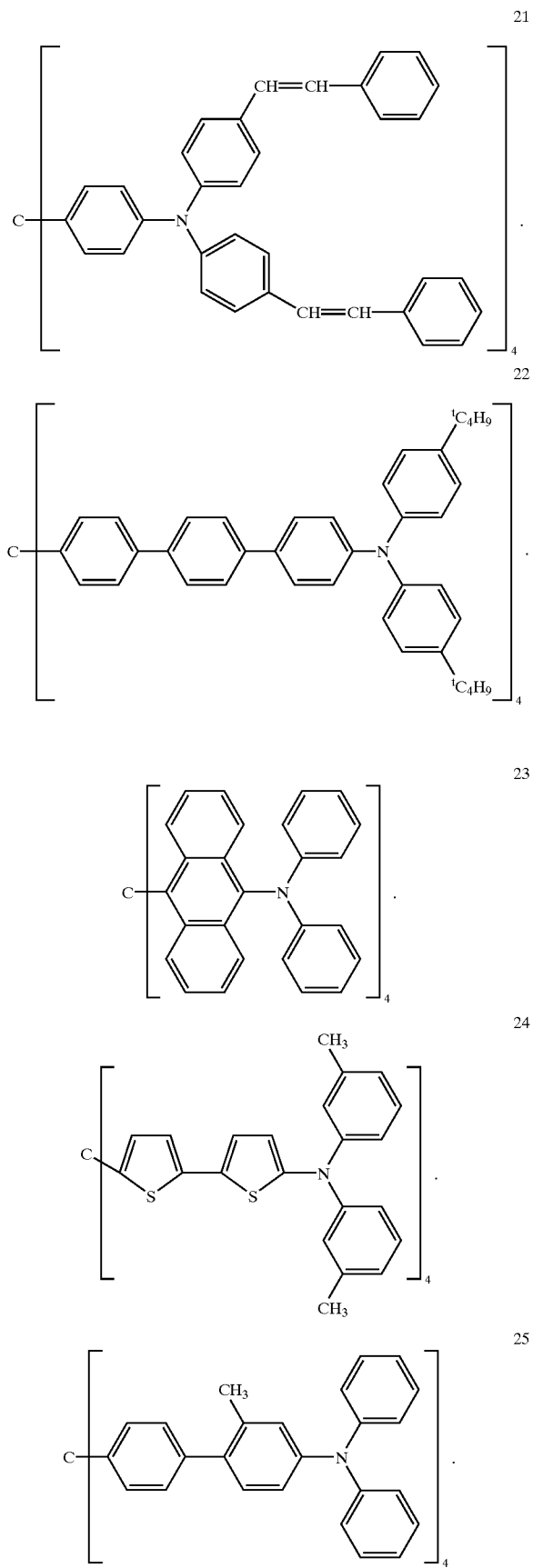
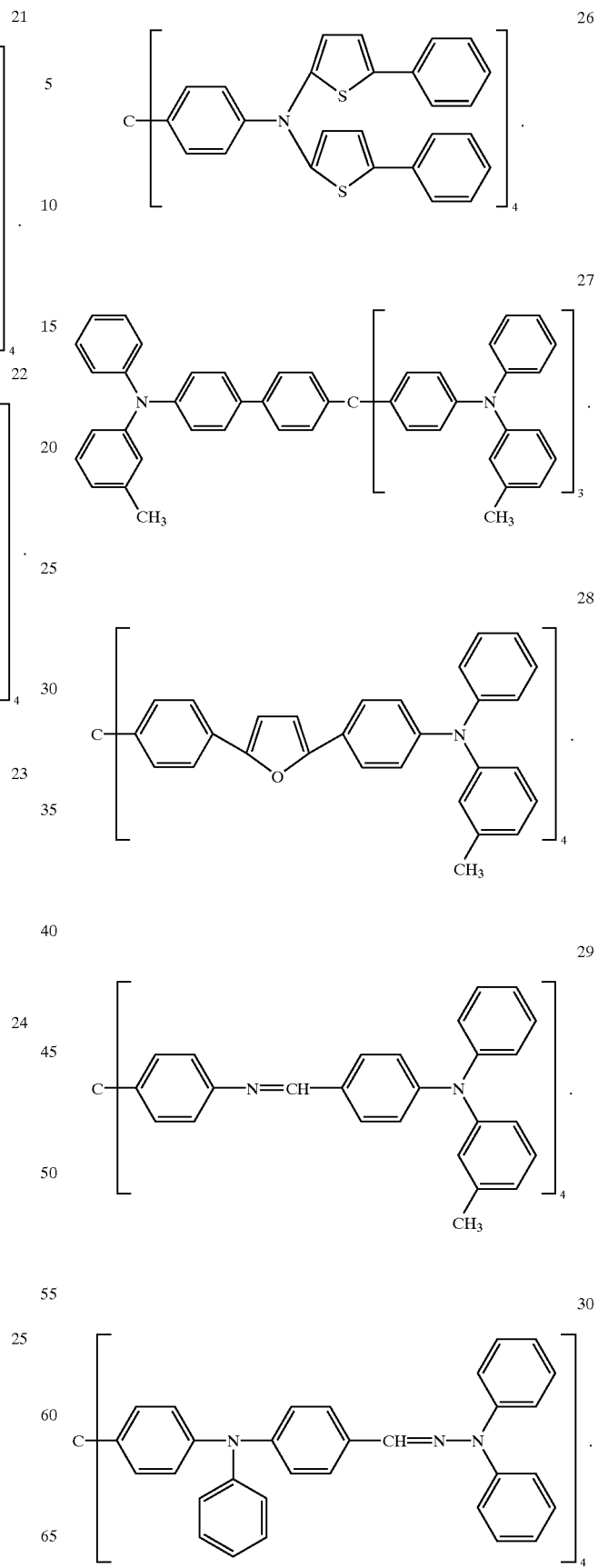

-continued

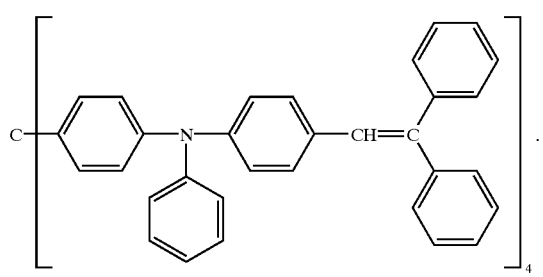 31

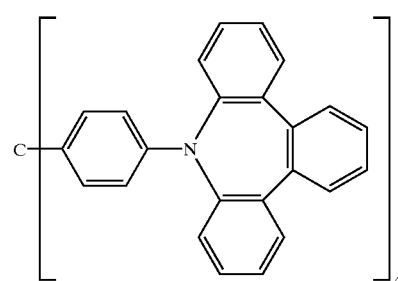 32

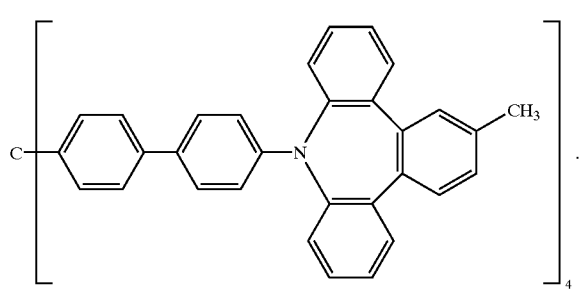 33

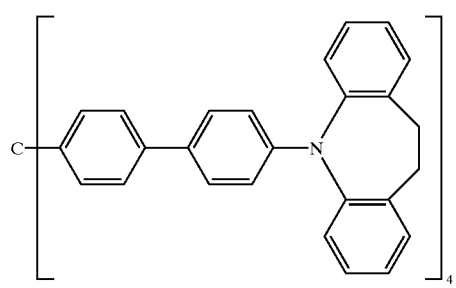 34

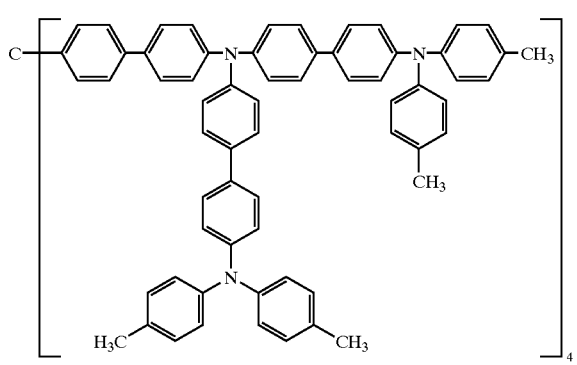 35

-continued

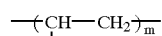
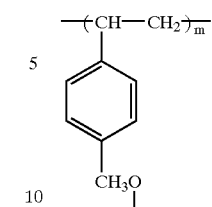 36

(weight average molecular weight: 23,000 as polystyrene)

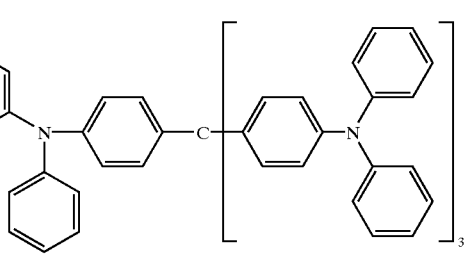 37

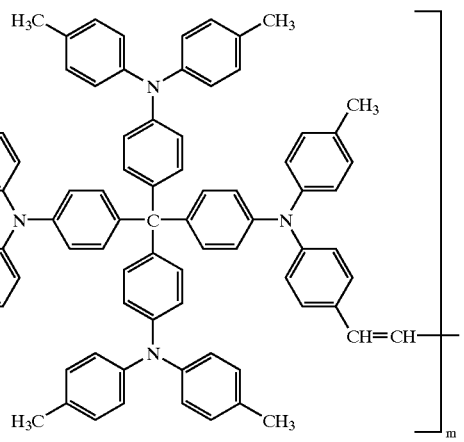

(weight average molecular weight: 19,000 as polystyrene)

The compound represented by formula (I) of the present invention may be synthesized, for example, by the Ullmann reaction using a metal copper catalyst and a base (see, U.S. Pat. No. 4,764,625) or by the Suzuki reaction of coupling a boron compound and a halogen compound using a palladium catalyst (see, *Synth. Commun.*, 11, 513 (1981)).

Synthesis examples of the compound of the present invention are specifically described below.

SYNTHESIS EXAMPLE 1

Synthesis of Compound (2)

2.0 g (2.43 mmol) of tetrakis(4-iodophenyl)methane (synthesized by the method described in *J. Am. Chem. Soc.*, 113, 4696 (1991)), 3.6 g (19.4 mmol) of 3-methyldiphenylamine, 1.4 g (24.3 mmol) of potassium hydroxide and 0.62 g (9.72 mmol) of copper powder were mixed with 50 ml of decalin, and the resulting solution was stirred under heating at an outer temperature of 200° C. for about 24 hours in a nitrogen stream. After cooling the solution nearly to room temperature, chloroform was added thereto and then insoluble matters were removed by Celite filtration. Thereafter, water was added to the filtrate, the extraction operation was performed, and the reaction concentrate obtained was purified by silica gel column chromatography to obtain crystalline tetrakis[(3-methyldiphenylamino)phenyl]methane (Compound (2)) having mixed therein a small amount of the raw material 3-methyldiphenylamine. By adding ethanol thereto and stirring and filtering the mixture, 1.4 g (55.1%) of almost pure Compound (2) was obtained as pale yellow crystal. Thereafter, the compound was further recrystallized with a mixed solvent of tetrahydrofuran and ethanol. As a result, 0.9 g (35.4%) of pure Compound (2) could be obtained. mp.: 264–266° C.

mass (FAB-posi): 1045 ($M^+$); $^1$H-NMR (CDCl$_3$): d (ppm) 2.23 (12H, s), 6.80–7.25 (52H, m).

SYNTHESIS EXAMPLE 2

Synthesis of Compound (16)

Compound (16) was synthesized in the same manner as in Synthesis Example 1 except for using 5H-dibenz[b,f] azepine in place of 3-methyldiphenylamine. Yield: 15%.

SYNTHESIS EXAMPLE 3

Synthesis of Compound (32)

Compound (32) was synthesized in the same manner as in Synthesis Example 1 except for using 9H-tribenz[b,d,f] azepine (synthesized by the method described in *J. Org. Chem.*, 56, 3906 (1991)) in place of 3-methyldiphenylamine. Yield: 12%.

SYNTHESIS EXAMPLE 4

Synthesis of Compound (8)

A toluene/dimethylformamide solution (30 ml/20 ml) containing 2.0 g (2.43 mmol) of tetrakis(4-iodophenyl) methane, 2.43 g (8.02 mmol) of 4-(3-methyldiphenylamino) phenylboronic acid, 0.1 g (0.087 mmol) of tetrakis (triphenylphosphine) palladium (O) and 6.0 ml (12.0 mmol) of an aqueous 2M sodium carbonate solution was refluxed under heating for about 10 hours in a nitrogen stream. The reaction solution was extracted with chloroform, after-treated in a usual manner, dried over anhydrous magnesium sulfate and concentrated under reduced pressure. The residue was purified by silica gel column chromatography and recrystallized with a tetrahydrofuran/ethanol mixed solvent. As a result, Compound (8) could be obtained in a yield of 45%.

The luminescent device of the present invention is a device obtained by forming a light emitting layer or a plurality of organic compound thin films including a light emitting layer between a pair of electrodes of anode and cathode. In addition to the light emitting layer, the device may have a hole injecting layer, a hole transporting layer, an electron injecting layer, an electron transporting layer, a protective layer and the like. These layers each may have other functions. For forming respective layers, various materials may be used.

The anode feeds holes to the hole injecting layer, the hole transporting layer or the light emitting layer. A metal, an alloy, a metal oxide, an electrically conductive compound or a mixture thereof may be used therefor, and a material having a work function of 4 eV or more is preferred. Specific examples thereof include an electrically conductive metal oxide such as tin oxide, zinc oxide, indium oxide and indium tin oxide (ITO), a metal such as gold, silver, chromium and nickel, a mixture or laminate of the metal with the electrically conductive metal oxide, an inorganic electrically conductive material such as copper iodide and copper sulfide, an organic electrically conductive material such as polyaniline, polythiophene and polypyrrole, and a laminate of the material with ITO. Of these, an electrically conductive metal oxide is preferred and in view of productivity, high electrical conductivity and transparency, ITO is more preferred. The thickness of the anode may be freely selected depending on the material used, however, it is usually in the range of preferably from 10 nm to 5 μm, more preferably from 50 nm to 1 μm, still more preferably from 100 to 500 nm.

The anode is usually used as a layer formed on a soda lime glass, an alkali-free glass or a transparent resin substrate. In the case of using a glass, the constructive material thereof is preferably an alkali-free glass so as to reduce the ion dissolved out from the glass. In the case of using a soda lime glass, the glass is preferably subjected to barrier coating with silica or the like. The thickness of the substrate is not particularly limited as long as the substrate can maintain the mechanical strength, however, in the case of using a glass, it is usually 0.2 mm or more, preferably 0.7 mm or more.

The anode may be prepared by various methods according to the material used and for example, in the case of ITO, the film is formed by an electron beam method, a sputtering method, a resistance heating evaporation method, a chemical reaction method (sol-gel process) or a method of coating an indium tin oxide dispersion.

By subjecting the anode to rinsing or other treatments, the device driving voltage can be lowered or luminescence efficiency can be increased. For example, in the case of ITO, UV-ozone treatment is effective.

The cathode feeds electrons to the electron injecting layer, the electron transporting layer or the light emitting layer and is selected by taking account of the adhesion to the layer adjacent to the negative electrode, such as an electron injecting layer, an electron transporting layer and a light emitting layer, the ionization potential and the stability. As the material for the cathode, a metal, an alloy, a metal oxide, an electrically conductive compound or a mixture thereof may be used and specific examples thereof include an alkali metal (e.g., Li, Na, K) and a fluoride thereof, an alkaline earth metal (e.g., Mg, Ca) and a fluoride thereof, gold, silver, lead, aluminum, a sodium-potassium alloy or mixed metal, a lithium-aluminum alloy or mixed metal, a magnesium-silver alloy or mixed metal, and a rare earth metal such as indium and ytterbium. Of these, materials having a work function of 4 eV or less are preferred, and aluminum, a lithium-aluminum alloy or mixed metal and a magnesium-silver alloy or mixed metal are more preferred. The thickness of the cathode may be freely selected depending on the material used, however, it is usually in the range of preferably from 10 nm to 5 μm, more preferably from 50 to 1 μm, still more preferably from 100 nm to 1 μm.

The cathode may be prepared by an electron beam method, a sputtering method, a resistance heating evaporation method or a coating method. A sole metal may be deposited or two or more components may be simultaneously deposited. Furthermore, a plurality of metals may be simultaneously deposited to form an alloy electrode or an alloy previously prepared may be deposited.

The anode and the cathode each preferably has a low sheet resistance of hundreds of Ω/□ or less.

The material for the light emitting layer may be any as long as it can form a layer having a function of injecting holes from the anode, hole injecting layer or hole transporting layer and at the same time injecting electrons from the cathode, electron injecting layer or electron transporting layer upon application of an electric field, a function of transferring charges injected, or a function of offering a chance such that the hole and the electron recombine and emit light. The light emitting layer preferably contains the compound of the present invention but a luminescent material other than the compound of the present invention may also be used. Examples thereof include various metal complexes including metal complexes and rare earth complexes of benzoxazole derivative, benzimidazole derivative, benzothiazole derivative, styrylbenzene derivative, polyphenyl derivative, diphenylbutadiene derivative, tetraphenylbutadiene derivative, naphthalimide derivative, coumarin derivative, perylene derivative, perynone derivative, oxadiazole derivative, aldazine derivative, pyralidine derivative, cyclopentadiene derivative, bisstyrylanthracene derivative, quinacridone derivative, pyrrolopyridine derivative, thiazolopyridine derivative, cyclopentadiene derivative, styrylamine derivative, aromatic dimethylidyne compound or 8-quinolinol derivative, and polymer compounds such as polythiophene, polyphenylene and polyphenylenevinylene. The thickness of the light emitting layer is not particularly limited, however, it is usually in the range of preferably from 1 nm to 5 μm, more preferably from 5 nm to 1 μm, still more preferably from 10 to 500 nm.

The method for forming the light emitting layer is not particularly limited and a resistance heating evaporation method, an electron beam method, a sputtering method, a molecular lamination method, a coating method (e.g., spin coating, casting, dip coating) or an LB method may be used. Of these, a resistance heating evaporation method and a coating method are preferred.

The material for the hole injecting layer or hole transporting layer may be any as long as it has any one of a function of injecting holes from the anode, a function of transporting holes and a function of blocking electrons injected from the cathode. Specific examples thereof include electrically conductive high molecular oligomers such as carbazole derivative, triazole derivative, oxazole derivative, oxadiazole derivative, imidazole derivative, polyarylalkane derivative, pyrazoline derivative, pyrazolone derivative, phenylenediamine derivative, arylamine derivative, amino-substituted chalcone derivative, styrylanthracene derivative, fluorenone derivative, hydrazone derivative, stilbene derivative, silazane derivative, aromatic tertiary amine compound, styrylamine compound, aromatic dimethylidyne-based compound, porphyrin-based compound, polysilane-based compound, poly(N-vinylcarbazole) derivative, aniline-based copolymer, thiophene oligomer and polythiophene. The hole injecting layer and the hole transporting are not particularly limited with respect to the thickness, however, the thickness is usually in the range of preferably from 1 nm to 5 μm, more preferably from 5 nm to 1 μm, still more preferably from 10 to 500 nm. The hole injecting layer and the hole transporting layer each may have a single layer structure comprising one or more of the above-described materials or may have a multi-layer structure comprising a plurality of layers which are the same or different in the composition.

The hole injecting layer and the hole transporting layer each is formed by a vacuum evaporation method, an LB method or a method of dissolving or dispersing the above-described hole injecting and transporting agent in a solvent and coating the solution (e.g., spin coating, casting, dip coating). In the case of the coating method, the material can be dissolved or dispersed together with a resin component. Examples of the resin component include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin and silicone resin.

The material for the electron injecting layer or electron transporting layer may be any as long as it has any one of a function of injecting electrons from the cathode, a function of transporting electrons and a function of blocking holes injected from the anode. Specific examples thereof include heterocyclic tetracarboxylic acid anhydrides such as triazole derivative, oxazole derivative, oxadiazole derivative, fluorenone derivative, anthraquinodimethane derivative, anthrone derivative, diphenylquinone derivative, thiopyran dioxide derivative, carbodiimide derivative, fluorenylidenemethane derivative, distyrylpyrazine derivative and naphthalene perylene, and various metal complexes such as metal complex of phthalocyanine derivative or 8-quinolinol derivative, and metal complex containing metal phthalocyanine, benzoxazole or benzothiazole as a ligand. The electron injecting layer and the electron transporting layer are not particularly limited with respect to the thickness, however, the thickness is usually in the range of preferably from 1 nm to 5 μm, more preferably from 5 nm to 1 μm, still more preferably from 10 to 500 nm. The electron injecting layer and the electron transporting layer each may have a single layer structure comprising one or more of the above-described materials or may have a multi-layer structure comprising a plurality of layers which are the same or different in the composition.

The electron injecting layer and the electron transporting layer each is formed by a vacuum evaporation method, an LB method or a method of dissolving or dispersing the above-described electron injecting and transporting agent in a solvent and coating the solution (e.g., spin coating, casting, dip coating). In the case of the coating method, the material can be dissolved or dispersed together with a resin component. Examples of the resin component include those described for the hole injecting and transporting layer.

The material for the protective layer may be any as long as it has a function of preventing a substance which accelerates deterioration of the device, such as moisture and oxygen, from entering the device. Specific examples thereof include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture containing tetrafluoroethylene and at least one comonomer, a fluorine-containing copolymer having a cyclic structure in the copolymer main chain, a water absorptive substance having a coefficient of water absorption of 1% or more, and a moisture-proofing substance having a coefficient of water absorption of 0.1% or less.

The method for forming the protective layer is not particularly limited and, for example, a vacuum evaporation method, a sputtering method, a reactive sputtering method, an MBE (molecular beam epitaxy) method, a cluster ion beam method, an ion plating method, a plasma polymerization method (high frequency exciting ion plating method), a plasma CVD method, a laser CVD method, a thermal CVD method, a gas source CVD method or a coating method may be used.

$Ar_1$, $Ar_2$, R, m and n in formula (V) are described below.

$Ar_1$ and $Ar_2$, which may be the same or different, each represents a substituted or unsubstituted aryl group, more specifically, a substituted or unsubstituted phenyl group, a naphthyl group, a phenanthrenyl group or a pyrenyl group. $Ar_1$ and $Ar_2$ may be combined directly or indirectly through a linking group.

When $Ar_1$ and $Ar^2$ in formula (V) each has a substituent, examples of the substituent include a halogen atom, an alkyl group, an aryl group, a heterocyclic group, a cyano group, a hydroxy group, a nitro group, a carboxy group, a sulfo group, an amino group, an alkoxy group, an aryloxy group, an acylamino group, an alkylamino group, a dialkylamino group, an N-alkyl-N-arylamino group, a diarylamino group, an anilino group, a ureido group, a sulfamoylamino group, an alkylthio group, an arylthio group, an alkoxycarbonylamino group, a sulfonamido group, a carbamoyl group, a sulfamoyl group, a sulfonyl group, an alkoxycarbonyl group, a heterocyclic oxy group, an azo group, an acyloxy group, a carbamoyloxy group, a silyloxy group, an aryloxycarbonylamino group, an imido group, a heterocyclic thio group, a sulfinyl group, a phosphonyl group, an aryloxycarbonyl group, an acyl group, a silyl group and an azolyl group.

Among these substituents in formula (V), preferred are a halogen atom, an alkyl group, an aryl group, an alkoxy group, an aryloxy group, a dialkylamino group, an N-alkyl-N-arylamino group and a diarylamino group, and more preferred are chlorine atom, a linear, branched or cyclic alkyl group having from 1 to 6 carbon atoms (e.g., methyl, t-butyl, cyclohexyl), an aryl group having from 6 to 18 carbon atoms (e.g., phenyl, naphthyl, biphenylyl), an alkoxy group having from 1 to 6 carbon atoms (e.g., methoxy, ethoxy, cyclohexyloxy), an aryloxy group having from 6 to 18 carbon atoms (e.g., phenoxy, naphthoxy), a dialkylamino group having from 2 to 8 carbon atoms (e.g., dimethylamino, diethylamino), an N-alkyl-N-arylamino group having from 7 to 15 carbon atoms (e.g., N-methyl-N-phenylamino, N-methyl-N-naphthylamino) and a diarylamino group having from 12 to 28 carbon atoms (e.g., diphenylamino, N-(3-methylphenyl)-N-phenylamino, dinaphthylamino).

In the case where $Ar_1$ and $Ar^2$ in formula (V) are not combined directly or indirectly, $Ar_1$ and $Ar_2$ each is preferably a substituted or unsubstituted phenyl group or a naphthyl group, more preferably a substituted or alkyl-substituted phenyl group or a naphthyl group.

$Ar_1$ and $Ar_2$ in formula (V) may be combined directly or indirectly through a linking group. Specific examples of the linking group in the case of $Ar_1$ and $Ar^2$ being combined indirectly are set forth below.

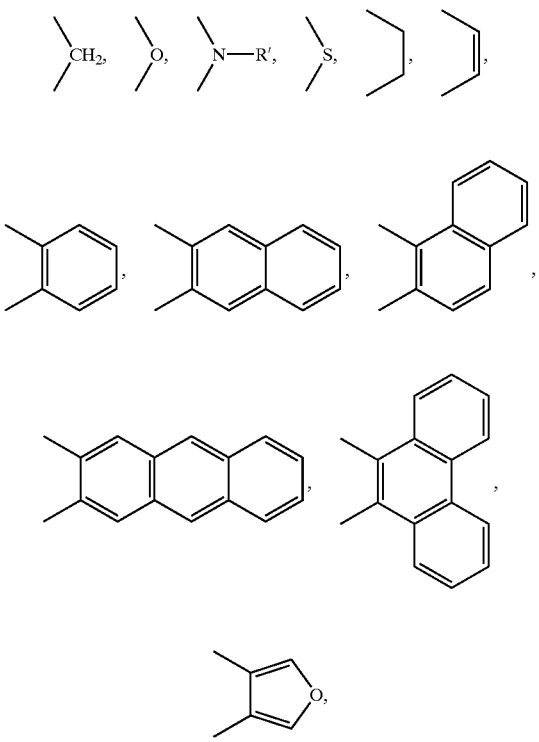

wherein R' represents an alkyl group (preferably having from 1 to 20 carbon atoms) or an aryl group (preferably having from 6 to 20 carbon atoms). These linking groups each may have a substituent and the substituent has the same meaning as the substituent of $Ar_1$ or $Ar^2$. The preferred groups are also the same.

R in formula (V) represents a halogen atom (e.g., fluorine, chlorine, bromine, iodine), an alkyl group preferably having from 1 to 20 carbon atoms, which may be substituted, an aryl group preferably having from 6 to 36 carbon atoms, which may be substituted, an alkoxy group preferably having from 1 to 20 carbon atoms, which may be substituted, an aryloxy group having from 6 to 36 carbon atoms, which may be substituted, a dialkylamino group preferably having from 2 to 20 carbon atoms, which may be substituted, an N-alkyl-N-arylamino group preferably having from 7 to 42 carbon atoms, which may be substituted, or a diarylamino group preferably having from 12 to 48 carbon atoms, which may be substituted. The number of carbon atoms here does not contain the carbon atoms of the substituent.

In formula (V), specific examples of the group except for halogen atom include:

for alkyl group: methyl group, ethyl group, isopropyl group, n-butyl group, t-butyl group, n-dodecyl group, cyclohexyl group;

for aryl group: phenyl group, naphthyl group, anthracenyl group, phenanthrenyl group, pyrenyl group, naphthacenyl group, pentacenyl group, pentacenyl group, pentaphenyl group;

for alkoxy group: methoxy group, ethoxy group, isopropoxy group, n-hexyloxy group, cyclohexyloxy group, octyloxy group, dodecyloxy group;

for aryloxy group: phenoxy group, naphthoxy group, anthracenoxy group, pentacenoxy group;

for dialkylamino group: dimethylamino group, diethylamino group, dibutylamino group, dioctylaminno group, N-ethyl-N-butylamino group;

for N-alkyl-N-arylamino group: N-methyl-N-phenylamino group, N-ethyl-N-phenylamino group, N-isopropyl-N-(3-methylphenyl)amino group, N-methyl-N-(1-naphthyl)amino group, N-butyl-N-(1-naphthacenyl)amino group; and for diarylamino group: diphenylamino group, N-phenyl-N-(1-naphthyl)amino group, N-(1-naphthyl)-N-(1-naphthyl)amino group, N-phenyl-N-(1-anthracenyl) amino group, N-(1-anthracenyl)-N-(1-phenanrenyl) amino group.

In the case where R in formula (V) has a substituent, examples of the substituent include a halogen atom, an alkyl group, an aryl group, a heterocyclic group, a cyano group, a hydroxy group, a nitro group, a carboxy group, a sulfo group, an amino group, an alkoxy group, an aryloxy group, an acylamino group, an alkylamino group, an anilino group, a ureido group, a sulfamoylamino group, an alkylthio group, an arylthio group, an alkoxycarbonylamino group, a sulfonamido group, a carbamoyl group, a sulfamoyl group, a sulfonyl group, an alkoxycarbonyl group, a heterocyclic oxy group, an azo group, an acyloxy group, a carbamoyloxy group, a silyloxy group, an aryloxycarbonylamino group, an imido group, a heterocyclic thio group, a sulfinyl group, a phosphonyl group, an aryloxycarbonyl group, an acyl group, a silyl group and an azolyl group. Among these, an alkyl group, an aryl group, an alkoxy group, an aryloxy group and an anilino group are preferred, and an alkyl group and a diarylamino group are more preferred.

R in formula (V) is preferably an alkyl group, an aryl group, an alkoxy group, a dialkylamino group or a diaryl group, more preferably an alkyl group or a diarylamino group. When m is an integer of 2 or greater, the Rs may be the same or different. When n is an integer of 2 or greater, the Rs bonded to each benzene skeleton may be the same of different.

m in formula (V) is an integer of from 0 to 4, preferably 0 or 1. n is an integer of from 1 to 4, preferably 1 or 2.

Specific examples of the compound represented by formula (V) of the present invention are set forth below, however, the present invention should not be construed as being limited thereto.

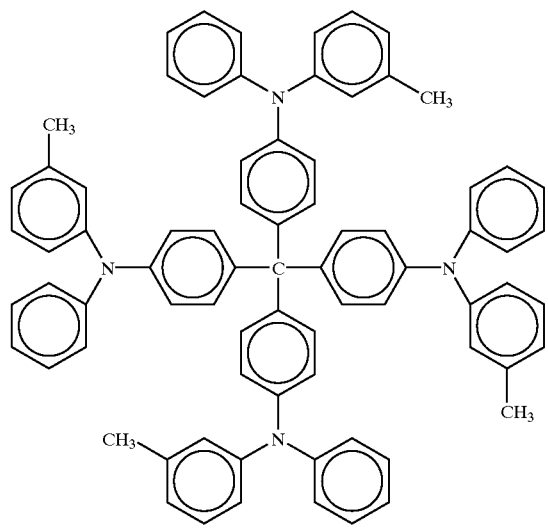

(1A)

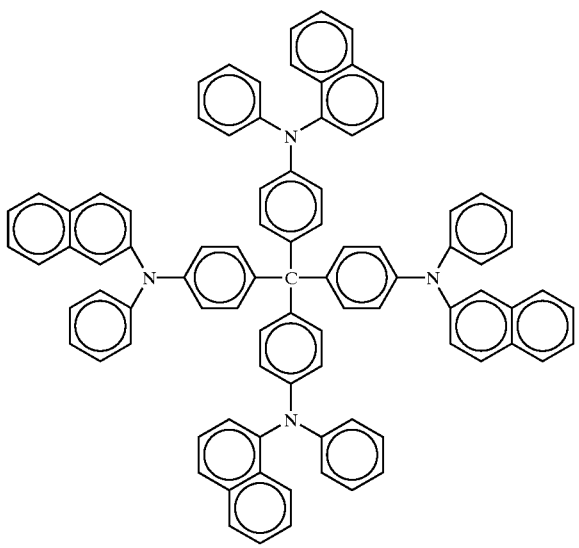

(2A)

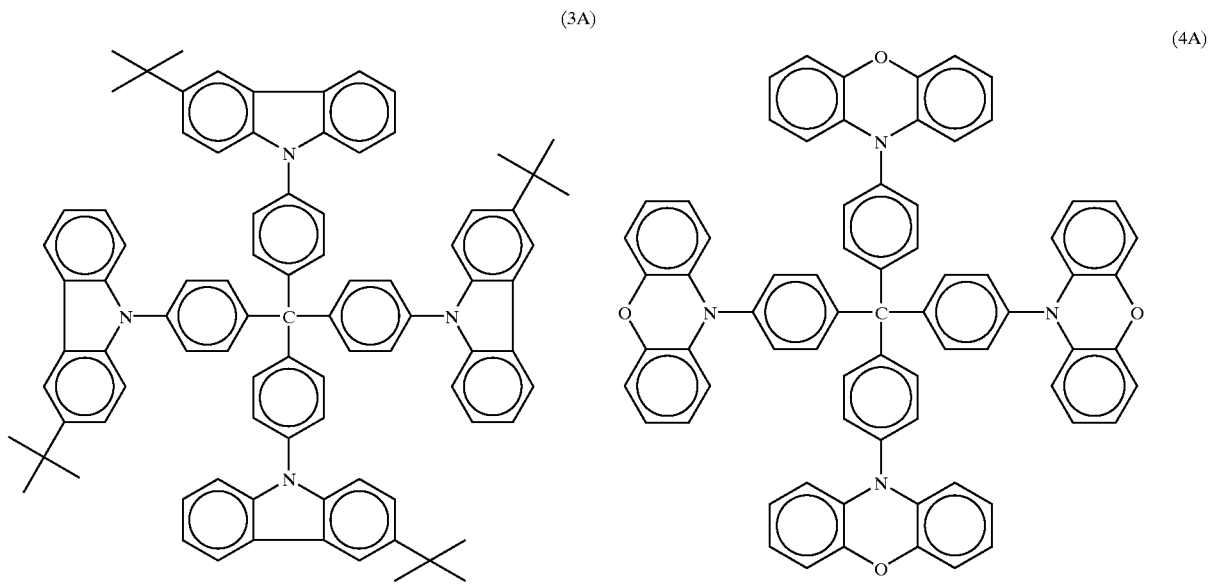
(3A)
(4A)
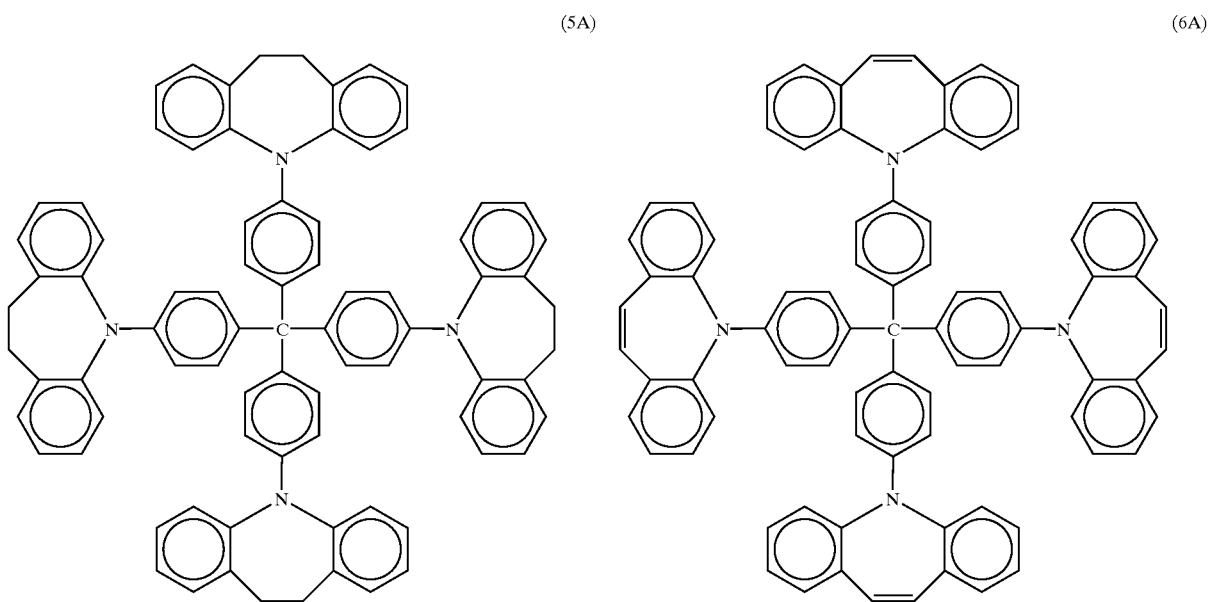
(5A)
(6A)

(7A)
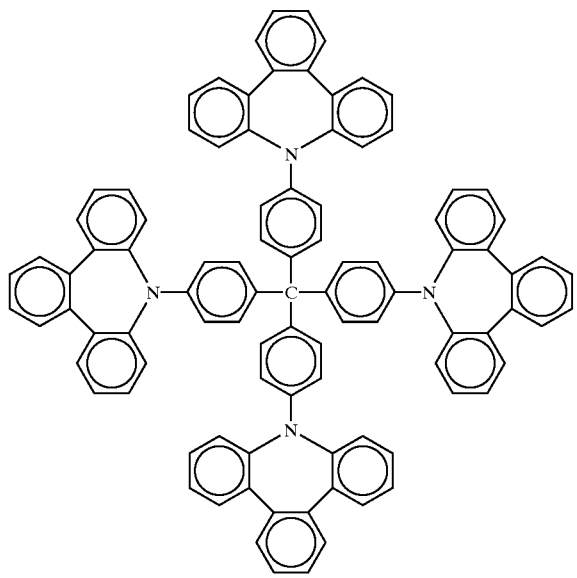
(8A)
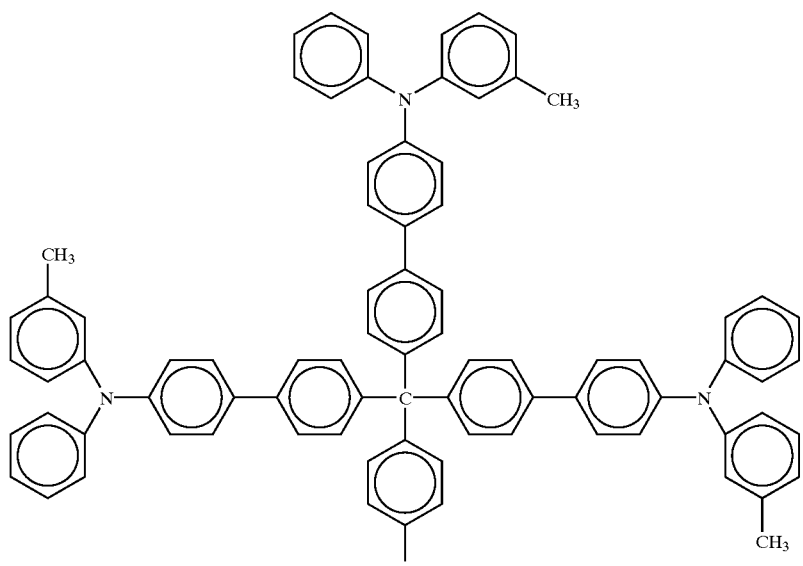
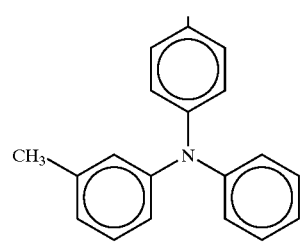

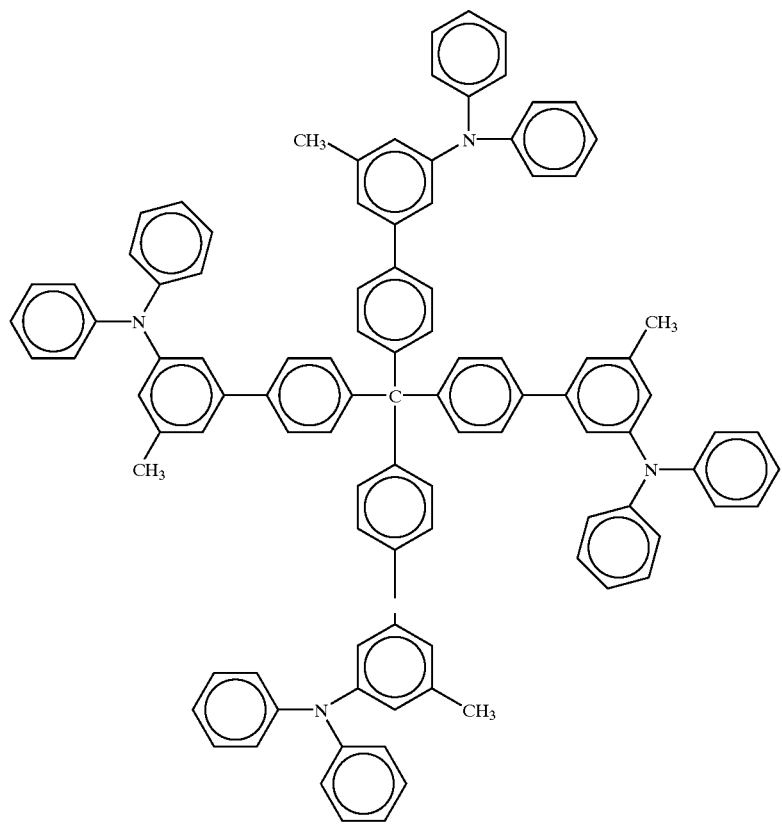
(9A)
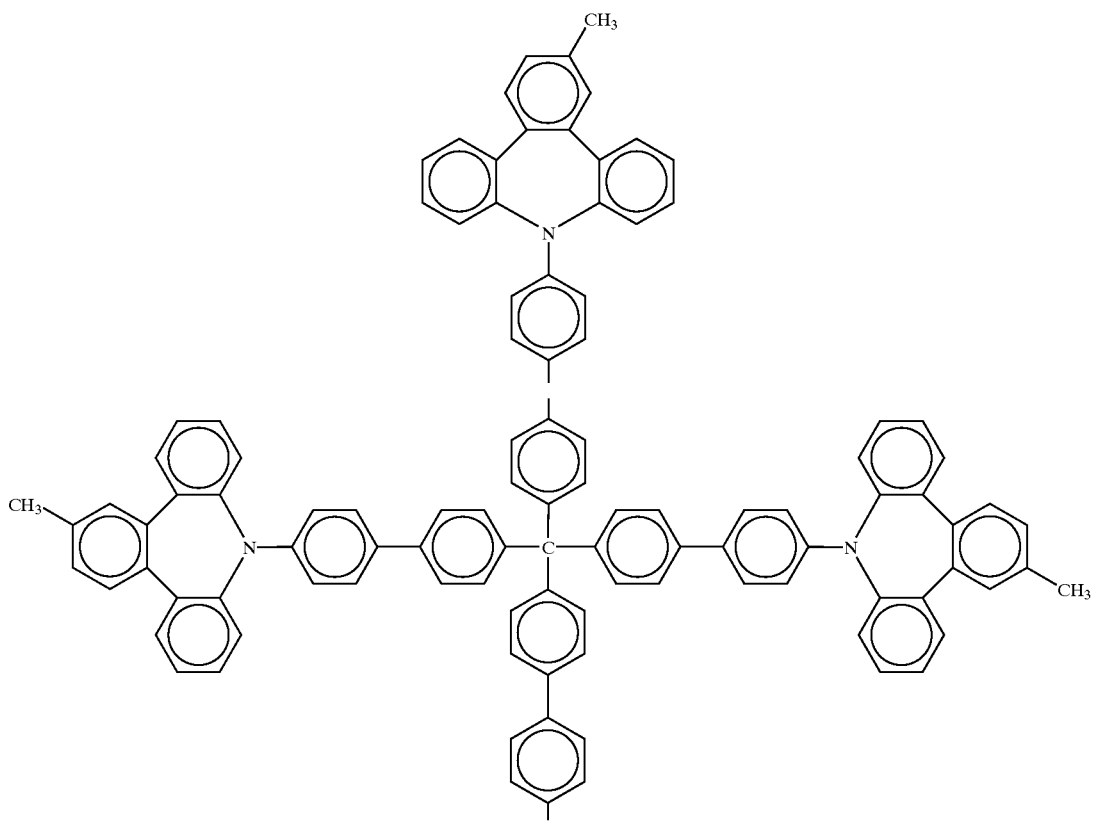
(10A)

-continued
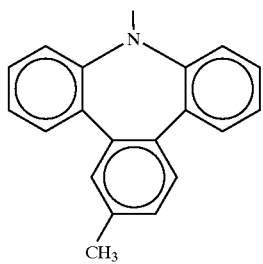
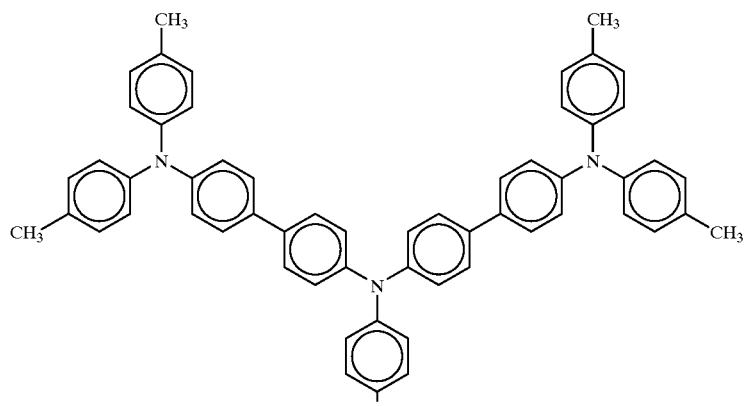
(11A)
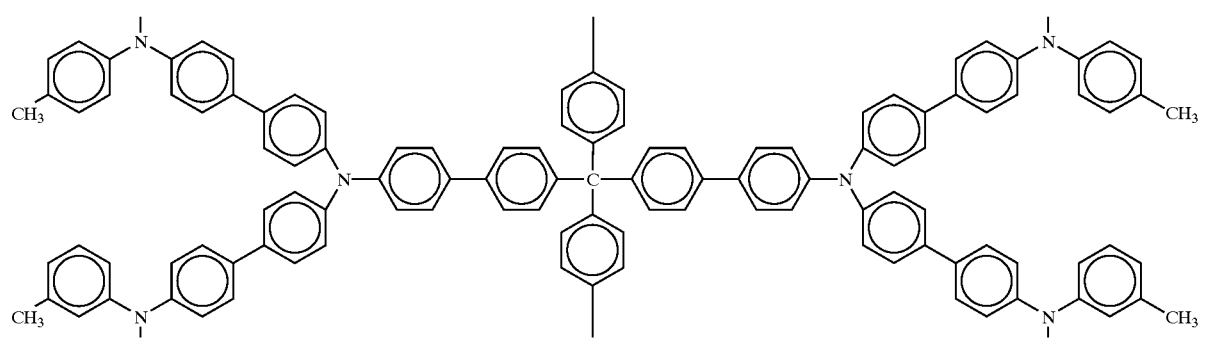
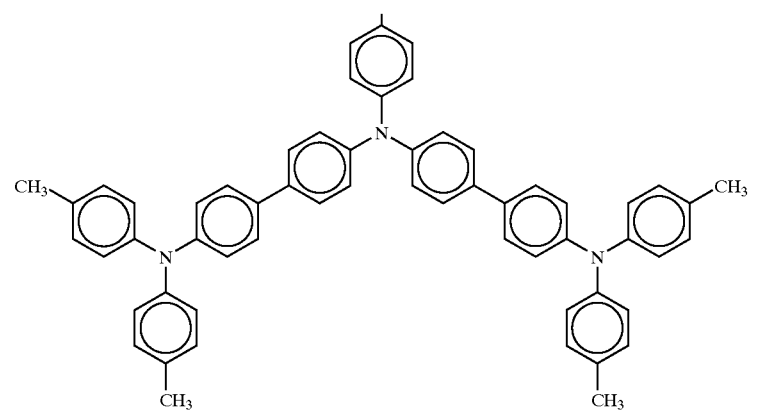

Synthesis examples of the compound of the present invention are described below. A representative synthesis example is shown in (Scheme 1).

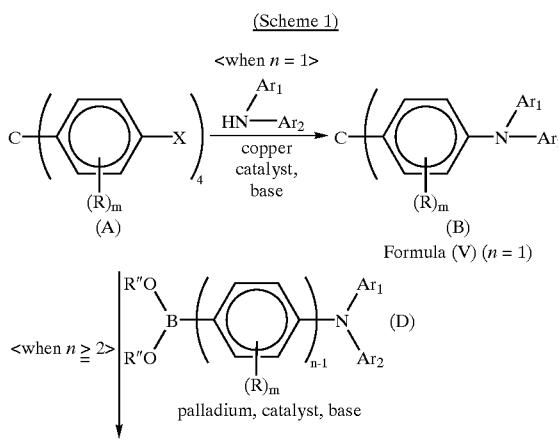

(Scheme 1)

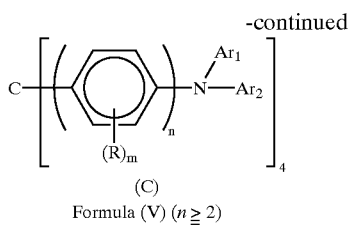

(C)
Formula (V) ($n \geq 2$)

wherein X represents bromine or iodine, R" represents hydrogen atom or an alkyl group, and $Ar_1$, $Ar_2$, R, m and n have the same meanings as defined above.

In (Scheme 1), the synthesis from (A) to (B) is a synthesis method based on the Ullmann reaction using a metal copper catalyst and a base (see, U.S. Pat. No. 4,764,625), and the synthesis from (A) to (C) is a synthesis method based on the Suzuki reaction of coupling a boron compound (D) and a halogen compound using a palladium catalyst (see, *Synth. Commun.*, 11, 513 (1981)).

The present invention is described in greater detail below by referring to the Examples, however, the present invention should not be construed as being limited thereto.

EXAMPLE 1

On a rinsed ITO substrate, a compound shown in Table 1 and tris(8-quinolinolate) aluminum(III) (Alq) were vacuum deposited ($8 \times 10^{-6}$ to $1 \times 10^{-5}$ Torr) in this order to have a thickness of 50 nm and 60 nm, respectively. After providing a patterned mask thereon, Al—Li (Al—Li alloy having an Li concentration of 15%) was deposited to have a thickness of 150 nm and further Al was deposited to have a thickness of 200 nm ($8 \times 10^{-6}$ to $1 \times 10^{-5}$ Torr).

A dc constant voltage was applied to the thus-obtained EL device to cause light emission using ITO as the anode and Al—Li as the cathode by means of a source measure unit Model 2400 (manufactured by Toyo Technica K.K.). The luminance was measured by a luminance meter BM-8 (manufactured by Topcon K.K.) and the emission wavelength was measured by a spectrum analyzer PMA-11 (manufactured by Hamamatsu Photonics K.K.). Furthermore, the device fabricated was left standing in a dry nitrogen atmosphere at 40° C. for 10 hours and then illuminated. At this time, the relative luminance (a value of luminance after aging expressed by a relative value taking the luminance immediately after the fabrication of the device as 100 ran (driving voltage: 13 V)) and the presence or absence of dark spots on the light emitting surface were evaluated. The results obtained are shown in Table 1.

TABLE 1

| Sample No. | Compound | Emission Wavelength, λmax (nm) | Maximum Luminance (cd/m²) | Minimum Driving Voltage (V) | Relative Luminance after Aging | Generation of Dark Spots | Remarks |
| --- | --- | --- | --- | --- | --- | --- | --- |
| 1 | Comparative Compound A | 520 | 7800 | 6 | 32 | generated | comparison |
| 2 | Compound 2 | 518 | 18900 | 4 | 91 | none | Invention |
| 3 | Compound 8 | 517 | 17800 | 4 | 88 | none | Invention |
| 4 | Compound 16 | 520 | 15900 | 4 | 86 | none | Invention |
| 5 | Compound 32 | 518 | 18420 | 3 | 92 | none | Invention |

Comparative Compound A (TPD)

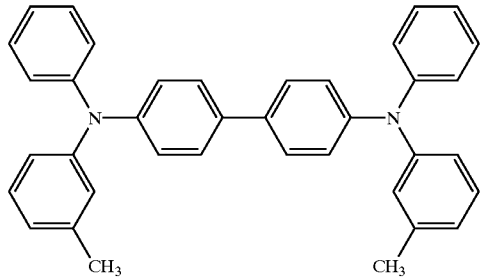

As seen from the results in Table 1, when the compound of the present invention is used, the minimum driving voltage is low and light emission with high luminance can be obtained. Furthermore, decrease in the luminance and generation of dark spots after storage at high temperatures are reduced and this reveals excellent durability.

EXAMPLE 2

In the same manner as in Example 1, after etching and rinsing an ITO substrate, 40 mg of poly(N-vinylcarbazole), 5 mg of a compound shown in Table 2, 12 mg of PBD (2-(4-biphenylyl)-5-(4-tert-butylphenyl)-1,3,4-oxadiazole) and 0.5 mg of 1,1,4,4-tetraphenylbutadiene were dissolved in 3 ml of 1,2-dichloroethane and the resulting solution was spin-coated on the rinsed ITO substrate. The organic thin film formed had a thickness of about 120 nm. On this organic thin film, a patterned mask (a mask capable of giving a light emission area of 5 mm×5 mm) was provided. Then, in an evaporation apparatus, magnesium silver (10:1) were co-deposited to have a thickness of 250 nm and further silver was deposited to have a thickness of 300 nm.

The device obtained was evaluated in the same manner as in Example 1. The results are shown in Table 2.

TABLE 2

| Sample No. | Compound | Emission Wavelength, λmax (nm) | Maximum Luminance (cd/m$^2$) | Minimum Driving Voltage (V) | Relative Luminance after Aging | Generation of Dark Spots | Remarks |
| --- | --- | --- | --- | --- | --- | --- | --- |
| 1 | Comparative Compound A* | 520 | 3450 | 10 | 18 | generated | Comparison |
| 2 | Compound 2 | 518 | 7930 | 5 | 88 | none | Invention |
| 3 | Compound 3 | 519 | 8260 | 6 | 83 | none | Invention |
| 4 | Compound 8 | 518 | 7250 | 5 | 81 | none | Invention |
| 5 | Compound 19 | 520 | 8330 | 5 | 82 | none | Invention |

*Comparative Compound A was the same as in Example 1.

As is apparent from the results in Table 2, in devices using the compound of the present invention, low voltage driving and light emission with high luminance can be obtained as compared with the device using the comparative compound. Furthermore, in the device using the comparative compound (TPD), conspicuous generation of dark spots was observed, whereas the devices using the compound of the present invention exhibited good surface state.

According to the present invention, an organic luminescent device capable of low voltage driving and light emission with high luminance can be obtained. Furthermore, even by a coating system which usually suffers from low luminance, good light emission property can be attained and a device advantageous in view of production cost and the like can be manufactured. As compared with devices using conventional compounds, a device having good durability can be manufactured.

EXAMPLE 3

Synthesis of compound (1A)

2.0 g (2.43 mmol) of tetrakis(4-iodophenyl)methane (synthesized by the method described in *J. Am. Chem. Soc.*, 113, 4696 (1991)), 3.6 g (19.4 mmol) of 3-methyldiphenylamine, 1.4 g (24.3 mmol) of potassium hydroxide and 0.62 g (9.74 mmol) of copper powder were mixed with 50 ml of decahydronaphthalene, and the resulting solution was stirred under heating at an outer temperature of 200° C. for about 24 hours in a nitrogen stream.

After cooling the solution nearly to room temperature, chloroform was added thereto and then insoluble matters were removed by Celite filtration. Thereafter, water was added to the filtrate, the extraction operation was performed, and the reaction concentrate obtained was purified by silica gel column chromatography to obtain crystalline tetrakis[(3-methyldiphenylamino)phenyl]methane (Compound (1A)) having mixed therein a small amount of the raw material 3-methyldiphenylamine. By adding ethanol thereto and stirring and filtering the mixture, 1.4 g (yield: 55.1%) of almost pure Compound (1A) was obtained as pale yellow crystal. Thereafter, the compound was further recrystallized with a mixed solvent of tetrahydrofuran and ethanol. As a result, 0.9 g (35.4%) of pure Compound (1A) was obtained. mp.: 264–266° C.

mass (FAB-posi): 1045 (M$^+$); $^1$H-NMR (CDCl$_3$): d (ppm) 2.23 (12H, s), 6.80–7.25 (52H, m).

EXAMPLE 4

Synthesis of Compound (6A)

Compound (6A) was synthesized in the same manner as in Example 3 except for using 5H-dibenz[b,f]azepine in place of 3-methyldiphenylamine. Yield: 15%.

EXAMPLE 5

Synthesis of Compound (7A)

Compound (7A) was synthesized in the same manner as in Synthesis Example 3 except for using 9H-tribenz[b,d,f] azepine (synthesized by the method described in *J. Org. Chem.*, 56, 3906 (1991)) in place of 3-methyldiphenylamine. Yield: 12%.

EXAMPLE 6

Synthesis of Compound (8A)

2.0 g (2.43 mmol) of tetrakis(4-iodophenyl)methane, 2.43 g (8.02 mmol) of 4-(3-methyldiphenylamino)phenylboronic acid, 0.1 g (0.087 mmol) of tetrakis(triphenylphosphine) palladium (0) and 6.0 ml (12.0 mmol) of an aqueous 2M sodium carbonate solution were mixed with a toluene/dimethylformamide solution (30 ml/20 ml) and the resulting mixture solution was refluxed under heating for about 10 hours in a nitrogen stream.

The reaction solution was extracted with chloroform, after-treated in a usual manner, dried over anhydrous magnesium sulfate and concentrated under reduced pressure. The residue was purified by silica gel column chromatography and recrystallized with a tetrahydrofuran/ethanol mixed solvent. As a result, Compound (8A) could be obtained in a yield of 45%.

The novel tetraarylmethane compound having a triarylamine structure within the molecule of the present invention has excellent storage stability and superior charge transporting ability. An organic electroluminescent (EL) device or electrophotographic photosensitive manufactured using a material containing the compound can be improved in the performance. In particular, when the compound of the present invention is used in the material for organic electroluminescent (EL) devices, the device can be greatly improved in the performance and exhibit high performance.

What is claimed is:

1. An organic luminescent device comprising a pair of electrodes having formed therebetween a light emitting layer or a plurality of organic compound thin films including a light emitting layer, wherein at least one layer contains a compound represented by the following formula (II):

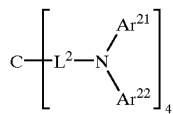

wherein $Ar^{21}$ and $Ar^{22}$ each represents an aryl group, $Ar^{21}$ and $Ar^{22}$ may be combined to each other directly or indirectly to form a ring, and $L^2$ represents a divalent linking group containing at least one of an aryl group and an aromatic heterocyclic group.

2. An organic luminescent device comprising a pair of electrodes having formed therebetween a light emitting layer or a plurality of organic compound thin films including a light emitting layer, wherein at least one layer comprises a polymer having dispersed therein a compound represented by the following formula (II):

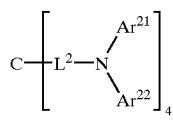

wherein $Ar^{21}$ and $Ar^{22}$ each represents an aryl group, $Ar^{21}$ and $Ar^{22}$ may be combined to each other directly or indirectly to form a ring, and $L^2$ represents a divalent linking group containing at least one of an aryl group and an aromatic heterocyclic group.

3. An organic luminescent device according to claim 1, wherein the compound of formula (II) is represented by the following formula (III):

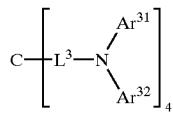

wherein $Ar^{31}$ and $Ar^{32}$ each represents an aryl group, $Ar^{31}$ and $Ar^{32}$ may be combined to each other directly or indirectly to form a ring, and $L^3$ represents an arylene group.

4. An organic luminescent device according to claim 1, wherein the compound of formula (II) is represented by the following formula (IV):

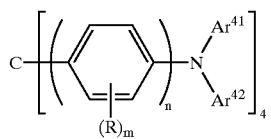

wherein $Ar^{41}$ and $Ar^{42}$ each represents an aryl group, $Ar^{41}$ and $Ar^{42}$ may be combined to each other directly or indirectly to form a ring, n represents an integer of from 1 to 4, R represents a substituent, and m represents an integer of from 0 to 4.

5. An organic luminescent device according to claim 2, wherein the compound of formula (II) is represented by the following formula (III):

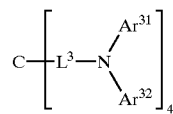

wherein $Ar^{31}$ and $Ar^{32}$ each represents an aryl group, $Ar^{31}$ and $Ar^{32}$ may be combined to each other directly or indirectly to form a ring, and $L^3$ represents an arylene group.

6. An organic luminescent device according to claim 2, wherein the compound of formula (II) is represented by the following formula (IV):

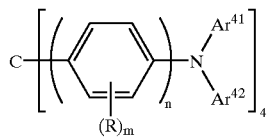

wherein $Ar^{41}$ and $Ar^{42}$ each represents an aryl group, $Ar^{41}$ and $Ar^{42}$ may be combined to each other directly or indirectly to form a ring, n represents an integer of from 1 to 4, R represents a substituent, and m represents an integer of from 0 to 4.

* * * * *